(12) United States Patent
Chen

(10) Patent No.: US 7,595,996 B1
(45) Date of Patent: Sep. 29, 2009

(54) EXPANDING CARD MECHANISM

(75) Inventor: Ben Chen, Taipei (TW)

(73) Assignee: Compupack Technology Co., Ltd., Taipei (TW)

( * ) Notice: Subject to any disclaimer, the term of this patent is extended or adjusted under 35 U.S.C. 154(b) by 0 days.

(21) Appl. No.: 12/193,706

(22) Filed: Aug. 18, 2008

(51) Int. Cl.
*H05K 1/14* (2006.01)

(52) U.S. Cl. .................. 361/737; 361/752; 361/800

(58) Field of Classification Search .......... 361/727, 361/737, 715, 730, 752, 790, 797, 800; 211/183–184
See application file for complete search history.

(56) References Cited

U.S. PATENT DOCUMENTS

| | | | | |
|---|---|---|---|---|
| 6,792,487 B2 * | 9/2004 | Kao | ............... | 710/74 |
| 7,121,846 B2 * | 10/2006 | Katayanagi | ............... | 439/76.1 |
| 7,242,586 B2 * | 7/2007 | Cheng et al. | ............... | 361/728 |
| 7,300,291 B2 * | 11/2007 | Kimura et al. | ............... | 439/131 |
| 2005/0079767 A1 * | 4/2005 | Ho et al. | ............... | 439/630 |

* cited by examiner

*Primary Examiner*—Hung S Bui

(57) ABSTRACT

An expanding card mechanism for protecting a circuit board is disclosed. The expanding card mechanism includes an upper case, a lower case, a plastic frame rack, a plastic baffle and an interface joint. The main feature is that two sides of the plastic frame rack form two positioning guiding tracks, respectively, for matching an inside concave slot guiding tracks of the two sides on the lower case and the plastic frame rack is slid well in the lower case until positioning convex blocks of the plastic frame are locked in positioning pinholes of the lower case. Furthermore, the two positioning convex blocks of the plastic baffle matching the two corresponding positioning guiding slots of the plastic frame rack are fixed well to form foolproof protection, and the circuit board and the interface joint are equipped with the lower case.

3 Claims, 7 Drawing Sheets

EXPANDING CARD MECHANISM

BACKGROUND OF THE INVENTION

1. Field of the Invention

The present invention relates to an expanding card mechanism, and more particularly, to the expanding card mechanism in combining an upper case with a lower case.

2. The Prior Arts

Electronic products often need different expanding card mechanisms to increase application areas such as various memory cards, USB cards, and wireless network cards. The expanding card mechanisms in these different application areas need a solid case to protect a circuit board. The solid case is generally made of stainless steel or magnesium alloy. Furthermore, an insulated plastic device matches a proper mechanism design in order that the case forms a vigorous combination to attain electrical insulation and protection function.

FIG. 1 and FIG. 2 are perspective views of a plastic frame rack, a joint and a lower case of a conventional expanding card mechanism. The plastic frame rack 10 has positioning concave slots 11a, 11b, 11c, 11d, 11e, 11f and 11g for matching a lower case 20 of C shaped positioning hooks 21a, 21b, 21c, 21d, 21e, 21f and 21g, such that the corresponding positioning hooks are well locked in the positioning concave slots. In addition, a positioning pinhole 17 of the plastic frame rack 10 matches a positioning convex block 27 of the lower case 20, a positioning hole 15 of the plastic frame rack 10 matches a positioning convex rim 25 of the lower case 20, and the plastic frame rack 10 is tightly combined with the lower case 20. The plastic frame rack 10 has two joint card slots 16a and 16b for matching two joint convex blocks 36a and 36b of the interface joint 30 to assemble the interface joint 30 in the plastic frame rack 10.

FIG. 3 is a perspective view of an upper case of a conventional expanding card mechanism. The upper case 40 has two positioning convex blocks 43a and 43b for matching two positioning concave slots 13a and 13b of the plastic frame rack 10, and two positioning convex chips 48a and 48b of the upper case 40 match two positioning concave slots 18a and 18b of the plastic frame rack 10. A circuit board (not shown) is assembled between the upper case 40 and the lower case 20. The upper case 40 has three guiding slots 49a, 49b, and 49c for matching the corresponding outer sides of the lower case 20 such that the upper case 40 is vigorously combined with the lower case 20.

FIG. 4 is a perspective view of a conventional expanding card mechanism. The expanding card mechanism 50 includes the interface joint 30, the upper case 40, and the lower case 20 (not shown). The lower case 20 is under the upper case 40. The expanding card mechanism 50 provides the interface joint 30 for electrical connection, and its solid case provides the protection function. One of the drawbacks of the conventional expanding card mechanism is that the plastic frame rack and the lower case are vertically assembled by combining the positioning concave slots with the positioning convex blocks. However, the assembly force provided only by combining the positioning concave slots with the positioning convex blocks is weak for the plastic frame rack and the lower case. Additionally, the vertical insertion assembly results in the thickness of the plastic frame rack being larger than that of the lower case, and therefore the location level of the plastic frame rack is higher than that of the lower case. This defect may make the plastic frame rack depart from the lower case due to the outer mechanical force in the following step of assembly manufacture, and even damage the expanding card mechanism.

Another drawback of the conventional expanding card mechanism is that the positioning concave slots of the plastic frame rack may depart from the positioning hooks of the lower case because of externally squeezing in the horizontal direction. Accordingly, the combination force for the plastic frame rack and the lower case is weak on the sides, the yield rate of the expanding card mechanism is affected, and similarly, the endurance and reliability of the final product are also degraded.

Therefore, it is greatly desired to provide a strong solid expanding card mechanism to deal with the externally squeezing force during the assembly procedure in order to improve the yield rate and reliability of the expanding card mechanism.

SUMMARY OF THE INVENTION

The primary objective of the present invention is to provide an expanding card mechanism for protecting a circuit board and forming the expanding card mechanism with an interface joint and a solid outer case.

The expanding card mechanism of the present invention includes an upper case, a lower case, a plastic frame rack, a plastic baffle, and an interface joint for encompassing and protecting the circuit board to provide an electric interface. The primary feature is that two convex rims are formed on the two opposite sides of the plastic frame rack to match the inner side guiding tracks on the two corresponding sides of the lower case, and the plastic frame rack is slid along the corresponding sides of the lower case until the positioning convex blocks of the plastic frame are locked in the positioning pinholes of the lower case. The plastic baffle with the positioning function is inserted into the plastic frame rack by using the two positioning convex blocks of the plastic baffle for matching the two corresponding positioning guiding slots to further provide foolproof protection. Thus the plastic baffle is fixed. Then, the circuit board and the interface joint are placed in the lower case. The positioning hooks of the upper case are positioned to the positioning concave slots of the plastic frame rack, and meanwhile the three positioning tracks of the lower case are inserted into three positioning guiding slots of the upper case, respectively. The upper case and the lower case are tightly combined so as to protect the circuit board and form an expanding card mechanism with the interface joint and the strong solid outer case.

Another objective of the present invention is to provide an assembly method for an expanding card mechanism by horizontally sliding the guiding tracks on the two sides of the plastic frame rack into the concave slots on the corresponding side of the lower case, and then inserting the plastic baffle with the positioning function into the positioning guiding slots of the plastic frame rack to accomplish the assembly of the plastic frame rack and the lower case. Then, the upper case, the interface joint, and the circuit board are combined with the plastic frame rack and the lower case to form the expanding card mechanism having the interface joint and the strong solid outer case.

Because the plastic frame rack is horizontally slid into the lower case in the assembly process of the expanding card mechanism, the combining force between the plastic frame rack and the lower case is much stronger. In addition, the outer rim of the plastic frame rack completely covers the lower case such that the plastic frame rack is not affected by the externally horizontal force, and the expanding card mechanism obtains further improvement for mechanical strength.

DETAILED DESCRIPTION OF THE PREFERRED EMBODIMENT

Figure 1:
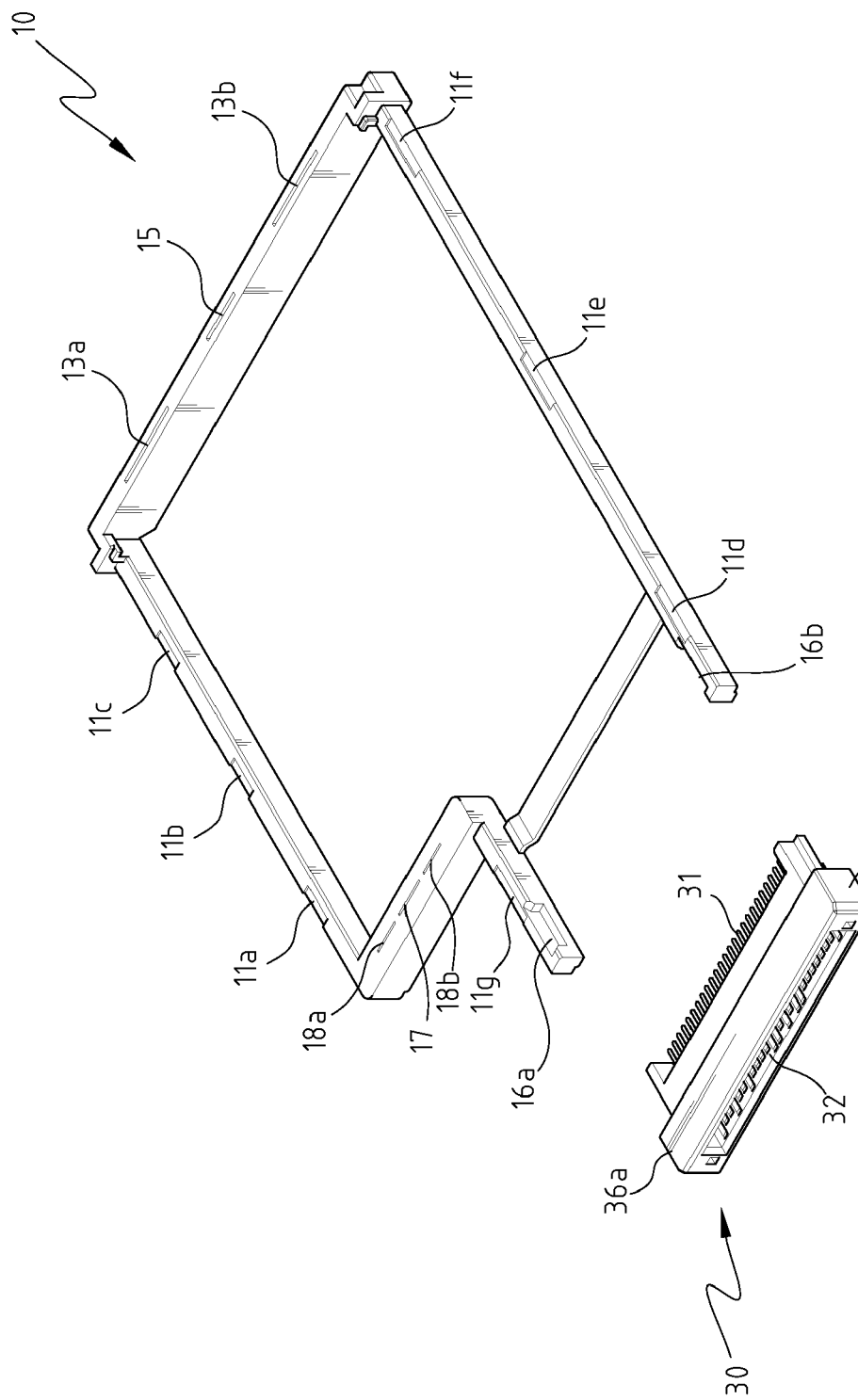
FIG. 1 is a perspective view of a plastic frame rack and a joint of a conventional expanding card mechanism.
Figure 2:
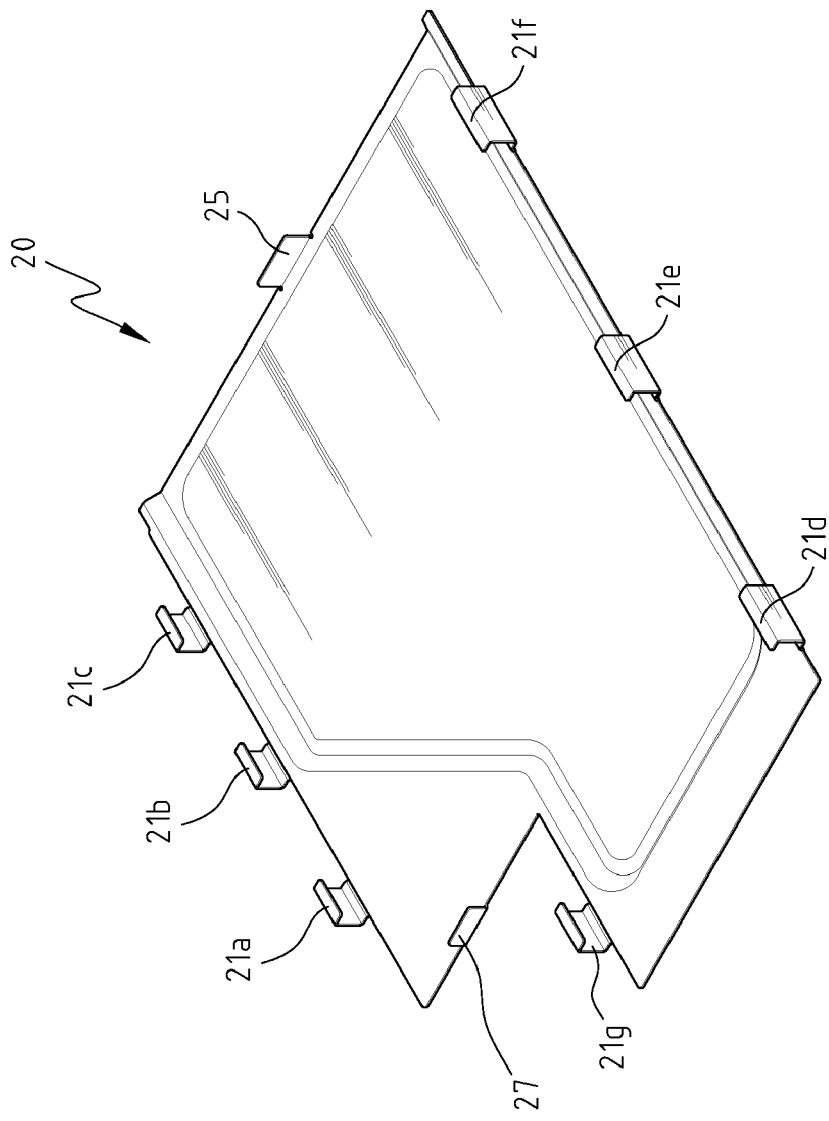
FIG. 2 is a perspective view of a lower case of a conventional expanding card mechanism.
Figure 3:
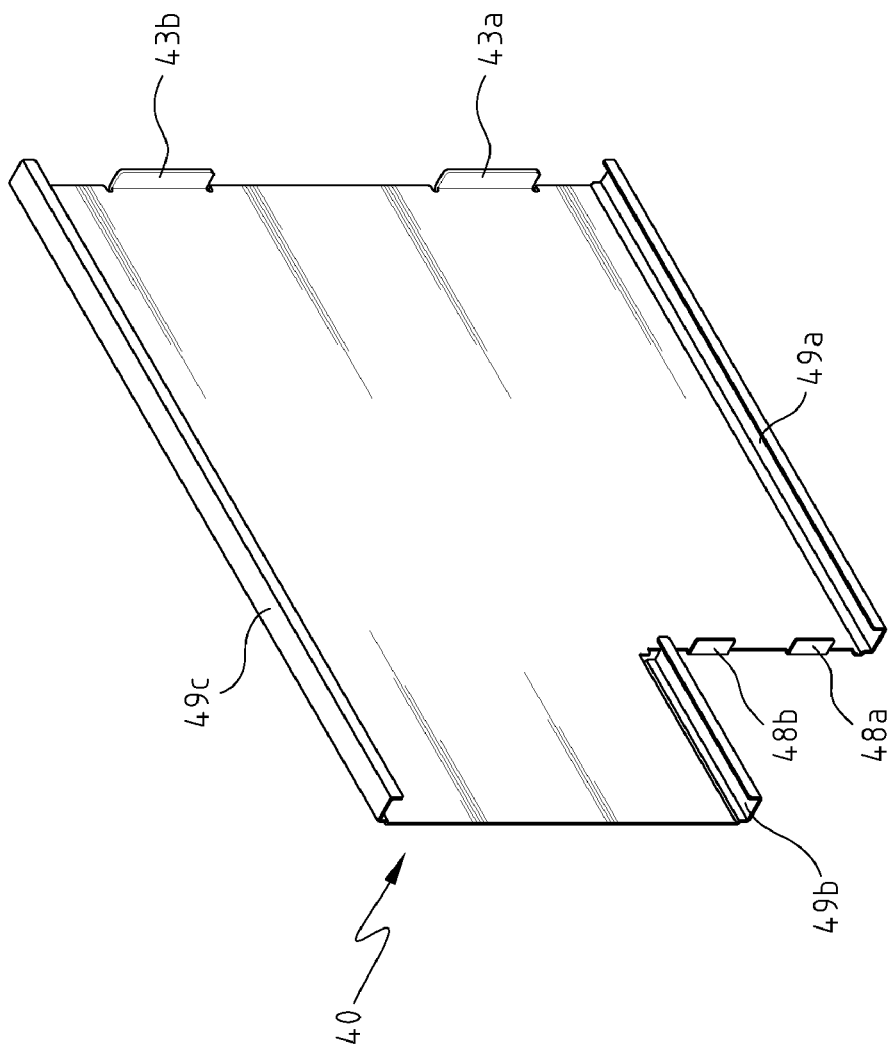
FIG. 3 is a perspective view of an upper case of a conventional expanding card mechanism.
Figure 4:
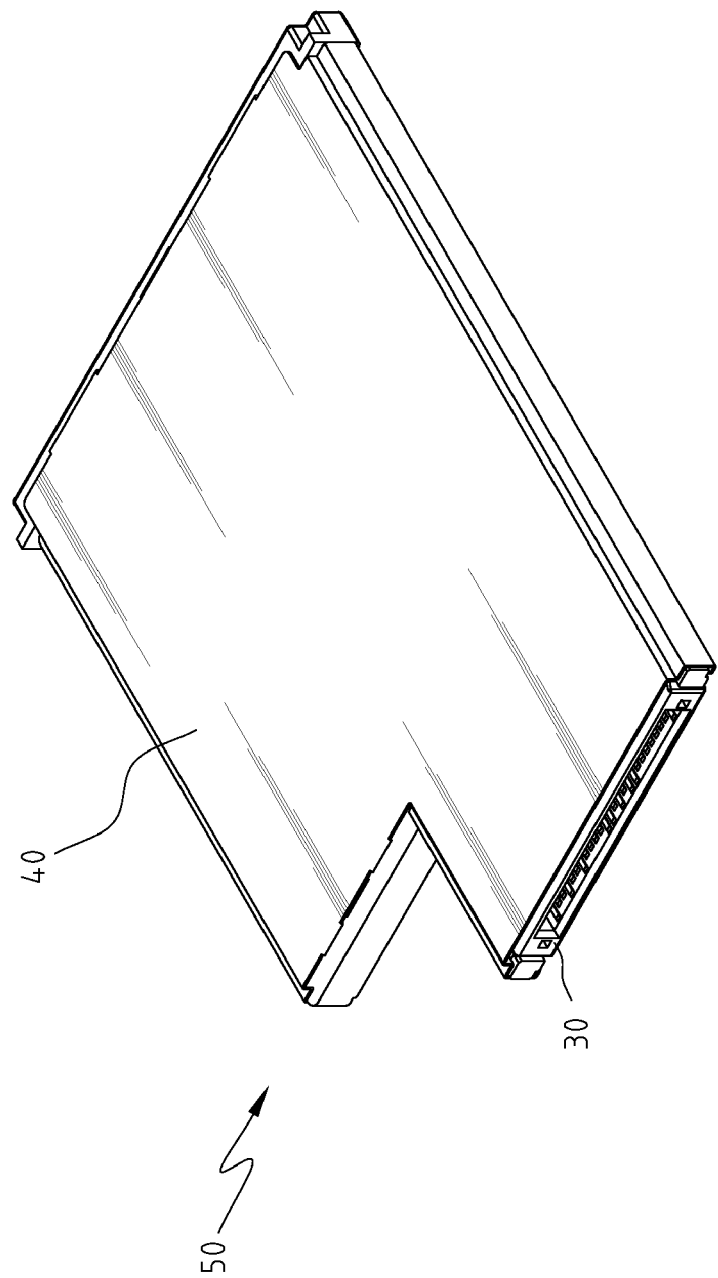
FIG. 4 is a perspective view of a conventional expanding card mechanism.
Figure 5:
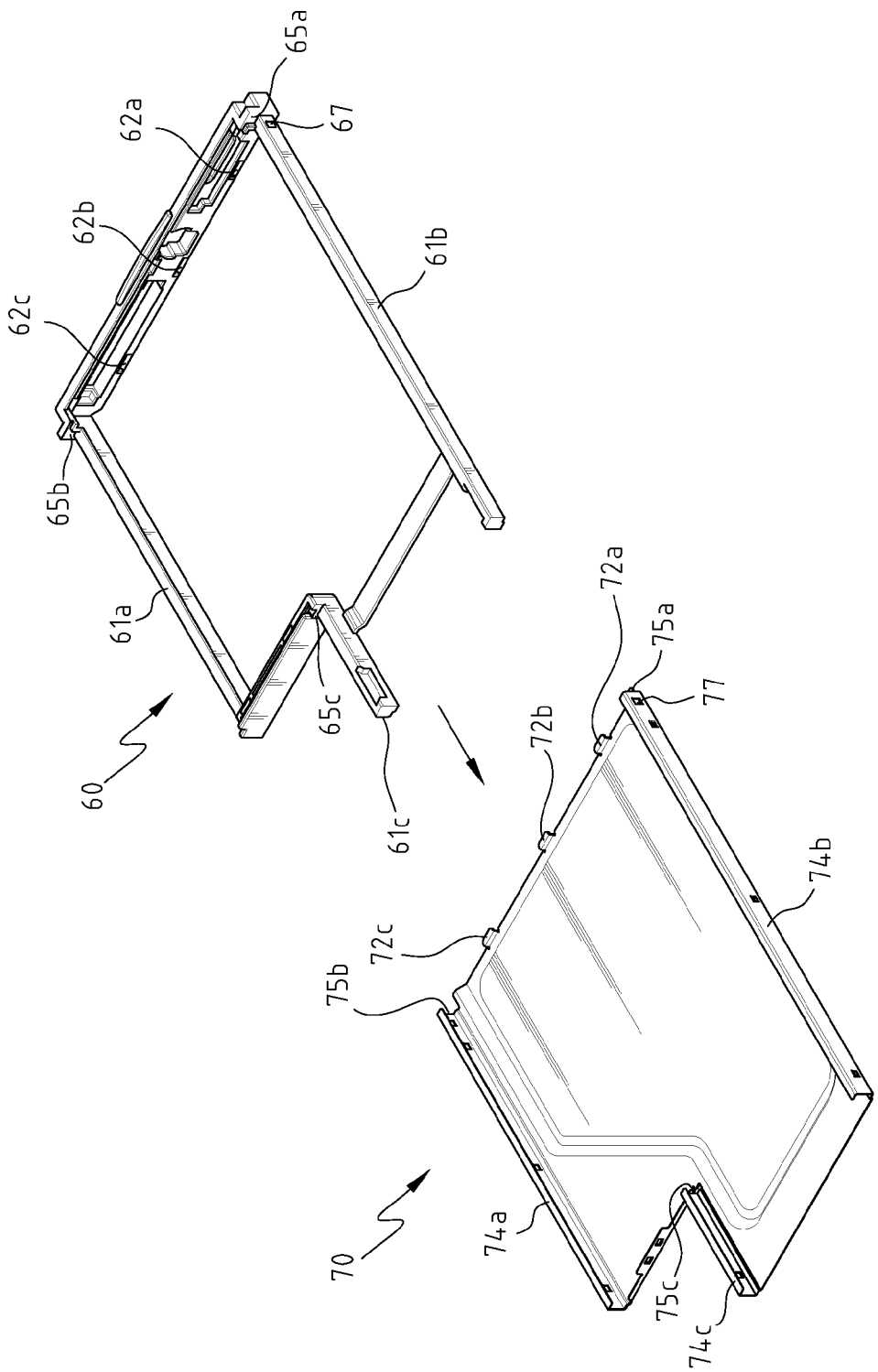
FIG. 5 is an exploded perspective view of a plastic frame rack and a lower case according to the present invention.

Referring to FIG. 5, an exploded perspective view of a plastic frame rack 60 and a lower case 70 is illustrated. Three positioning guiding tracks 61a, 61b, and 61c of the plastic frame rack 60 are horizontally slid along three concave slot guiding tracks 74a, 74b, and 74c of the lower case 70, as the direction of the arrow shown in FIG. 5. The positioning concave slots 62a, 62b, and 62c of the plastic frame rack 60 match the positioning hooks 72a, 72b, and 72c of the lower case 70 such that the plastic frame rack 60 is locked and fixed in the lower case 70. Meanwhile, the positioning convex blocks 65a, 65b, and 65c of the plastic frame rack 60 touch the positioning corners 75a, 75b, and 75c of the lower case 70 to stop further sliding. In addition, the fixed convex block 67 on the side of the plastic frame rack 60 (another convex block on the opposite side is not shown in FIG. 5) is slid into the fixed pinhole 77 of the lower case 70 to further lock the plastic frame rack 60.

Finally, the plastic frame rack 60 and the lower case 70 are vigorously combined together, and the positioning guiding tracks 61a, 61b, and 61c of the plastic frame rack 60 fully cover the concave slot guiding tracks 74a, 74b, and 74c of the lower case 70 such that the combination force is stronger than that of the prior arts. The lower case 70 protects the outer rim of the plastic frame rack 60, and therefore the plastic frame rack 60 is not higher than that of the lower case 70 to avoid the influence by the external force in the horizontal direction.

Figure 6:
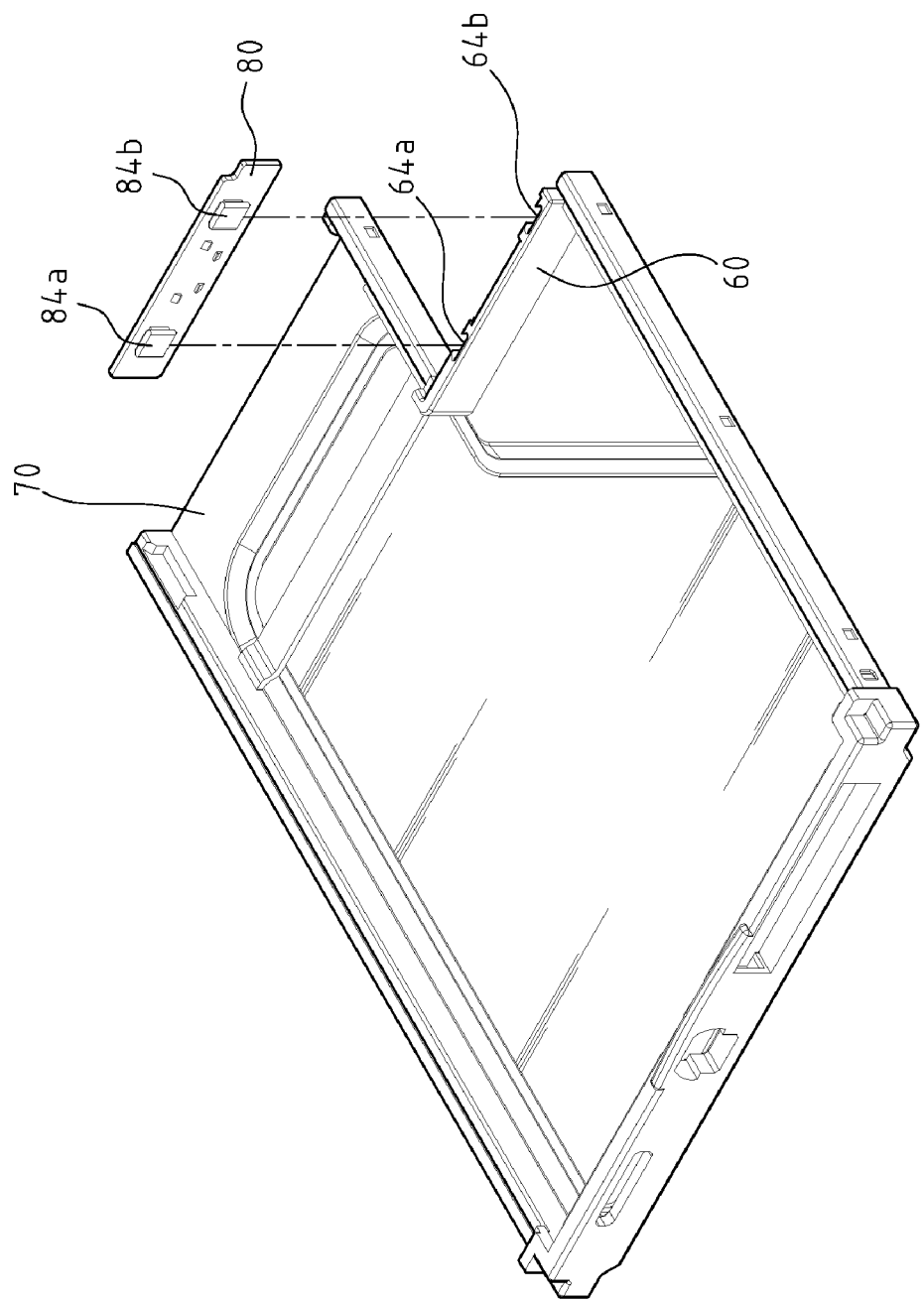
FIG. 6 is an exploded perspective view of a plastic baffle and the plastic frame rack according to the present invention.

Referring to FIG. 6, an exploded perspective view of a plastic baffle 80 and the plastic frame rack 60 is illustrated. The positioning guiding blocks 84a and 84b of the plastic baffle 80 are vertically inserted into the positioning guiding slots 64a and 64b of the plastic frame rack 60 to provide foolproof protection.

Figure 7:
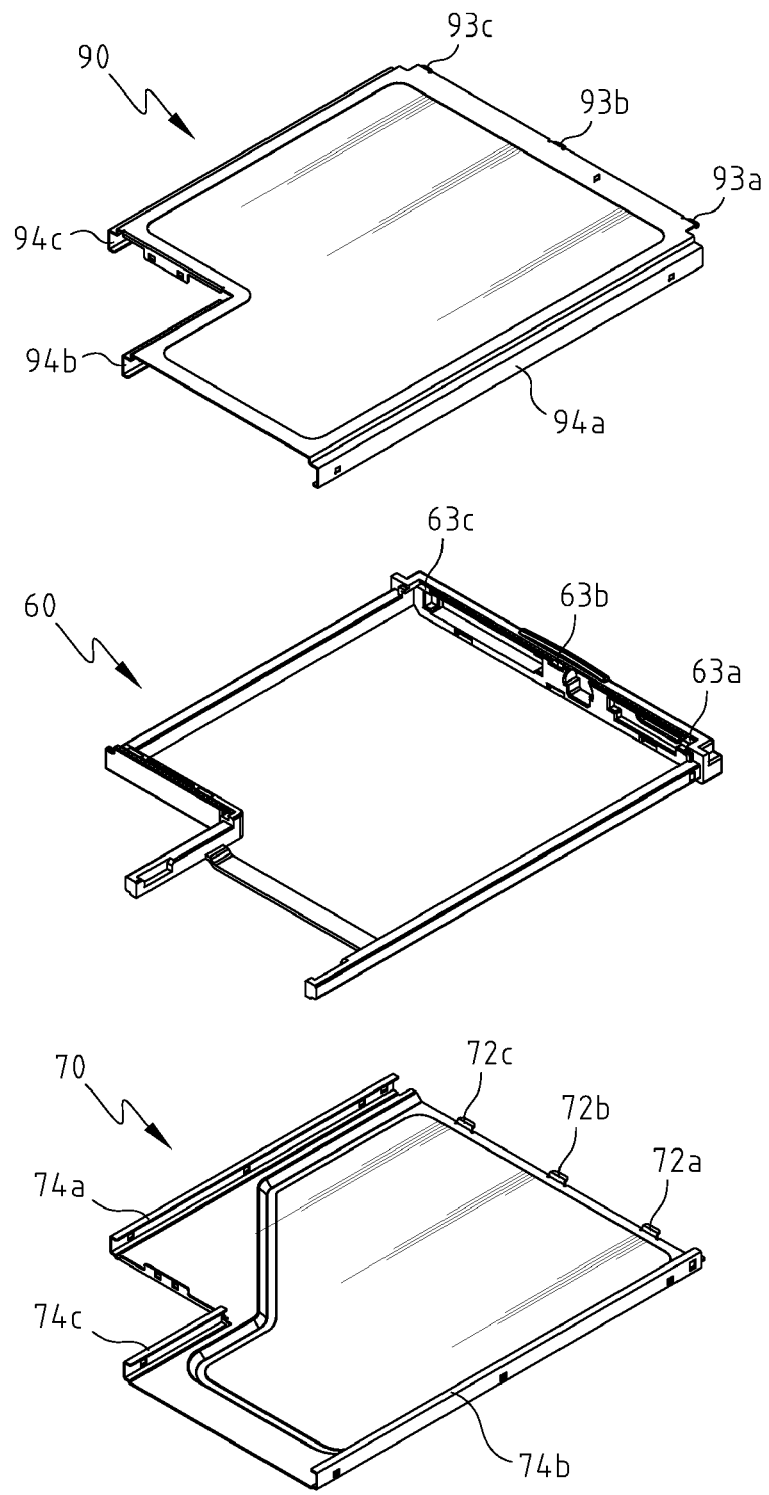
FIG. 7 is an exploded perspective view of an upper case, the plastic frame rack and the lower case according to the present invention.

Referring to FIG. 7, an exploded perspective view of an upper case 90, the plastic frame rack 60 and the lower case 70 is illustrated. The positioning hooks 93a, 93b, and 93c of the upper case 90 are locked in the positioning concave slots 63a, 63b, and 63c of the plastic frame rack 60, and meanwhile the outer rim guiding slots 94a, 94b, and 94c of the upper case 90 are locked in the concave slot guiding tracks 74a, 74b, and 74c of the lower case 70 to form a vigorous combination. The circuit board and the interface joint are contained between the upper case 90 and the lower case 70, and the assembly process is the same as that of the prior art without further description herein.

In the expanding card mechanism of the present invention, the outer rim of the plastic frame rack completely covers the upper case, and the fixed convex blocks are slid into the fixed pinholes, and then the plastic frame rack and the upper case are precisely positioned and fixed. The present invention provides strong combination force to avoid the parts of the expanding card mechanism from loosing or departing away due to the external force. Thus the expanding card mechanism of the present invention provides the advantages including a higher yield rate, a more vigorous case, an improved assembly process, and higher product reliability.

Although the present invention has been above described with reference to the preferred embodiments, it will be understood that the invention is not limited to the details described thereof. Various substitutions and modifications have been suggested in the forgoing description, and others will occur to those of ordinary skill in an art. Therefore, all such substitutions and modifications are intended to be embraced within the scope of the invention as defined in the appended claim.

What is claimed is:

1. An expanding card mechanism for covering and protecting a circuit board and an interface joint, comprising:

a plastic frame rack having a set of positioning guiding tracks, a set of fixed convex blocks, a set of positioning convex blocks, a set of positioning guiding slots, a first set of positioning concave slots and a second set of positioning concave slots, wherein the set of the positioning guiding tracks and the set of the fixed convex blocks are located on two opposite sides of the plastic frame rack, the set of the positioning convex blocks, the set of the positioning guiding slots, and the first and the second set of the positioning concave slots are located on another two opposite sides of the plastic frame rack;

a lower case having a set of concave slot guiding tracks, a set of fixed pinholes, a set of positioning hooks and a set of positioning corners, wherein the set of the concave slot guiding tracks matches the positioning guiding tracks of the plastic frame rack to make the plastic frame rack slide into the lower case until the set of the fixed pinholes is locked in the set of the fixed convex blocks of the plastic frame rack and the set of the positioning hooks is inserted into the first set of the positioning concave slots of the plastic frame rack, and meanwhile the set of the positioning corners touches the set of the positioning convex blocks of the plastic frame rack to stop the plastic frame rack sliding;

a plastic baffle having a set of positioning guiding blocks for matching the set of the positioning guiding slots of the plastic frame rack, wherein the plastic baffle is inserted into the set of the positioning guiding slots, and then fixed to provide foolproof protection; and an upper case having a set of positioning hooks and a set of outer rim guiding slots, wherein the set of the positioning hooks matches the second set of the positioning concave slots of the plastic frame rack, and is inserted into the second set of the positioning concave slots, and meanwhile the set of the outer rim guiding slots accommodates and covers the set of the concave slots guiding tracks of the lower case;

wherein the plastic frame rack, the lower case, the plastic baffle, and the upper case cover and protect the circuit board and the interface joint to form the expanding card mechanism having an electric interface and a protection function.

2. The expanding card mechanism according to claim 1, wherein the plastic frame rack is slid in the lower case in the horizontal direction.

3. The expanding card mechanism according to claim 1, wherein the vertical thickness of the plastic frame rack is smaller than that of the lower case and the outer rims on the two opposite sides of the plastic frame rack completely cover the lower case.

* * * * *